United States Patent [19]
McBride

[11] Patent Number: 5,987,237
[45] Date of Patent: Nov. 16, 1999

[54] FRAMEWORK FOR RULES CHECKING

[75] Inventor: John G. McBride, Fort Collins, Colo.

[73] Assignee: Hewlett-Packard Company, Palo Alto, Calif.

[21] Appl. No.: 08/922,793

[22] Filed: Sep. 2, 1997

[51] Int. Cl.[6] .................................................. G06F 9/455
[52] U.S. Cl. ........................... 395/500.01; 395/500.34; 395/500.25; 395/500.27
[58] Field of Search .............................. 364/512; 706/45; 395/500

[56] References Cited

U.S. PATENT DOCUMENTS

| | | | |
|---|---|---|---|
| 4,858,146 | 8/1989 | Shebini | 364/512 |
| 5,289,567 | 2/1994 | Roth | 395/133 |
| 5,394,524 | 2/1995 | DiNicola et al. | 395/163 |
| 5,522,022 | 5/1996 | Rao et al. | 395/140 |
| 5,787,274 | 7/1998 | Agrawal et al. | 395/613 |
| 5,802,508 | 9/1998 | Morgenstern | 706/55 |

*Primary Examiner*—Kevin J. Teska
*Assistant Examiner*—Samuel Broda

[57] ABSTRACT

A rules checking methodology ensures the quality of a structure or system having one or more elements and one or more nodes that serve as connection points to the elements. The rules checking methodology examines the elements and nodes of the structure and makes decisions regarding the quality of the structure according to parameters, or rules, provided.

52 Claims, 3 Drawing Sheets

FRAMEWORK FOR RULES CHECKING

FIELD OF THE INVENTION

This invention relates generally to rules checking, and more particularly to a methodology of rules checking of a structure having one or more structural elements and one or more nodes that serve as connection points to the elements.

BACKGROUND OF THE INVENTION

There exist many types of systems or structures, such as electrical, mechanical, software, and civil engineering structures, that must be tested during design and implementation phases. Each of these systems or structures may be thought of as having one or more elements and one or more nodes that serve as connection points to the elements. For example, a node may serve as an interconnection between two or more elements. In an electrical circuit, for instance, one or more electrical elements may be connected by nodes that interconnect the electrical elements. Likewise, a bridge is commonly made up of a number of wooden beams interconnected by bolts. A node may additionally be considered a connection point that connects an element to something else. For instance, a node may serve as a connection point to an external environment in which the structure is situated. Or, a node may serve as an input or output point of an element. In light of these definitions of a node, it is possible to have a structure having only one element and one node, two or more elements and one or more nodes, or one or more elements and two or more nodes, etc.

It is critical to the successful implementation of such a structure that structural and behavioral information about the elements and nodes of the structure be analyzed in some form or fashion during the design phase of the structure. Structural information is concerned with how elements and nodes interact with respect to one another. The structure of an element or node, or a group of elements and nodes, can affect the behavior of other elements or nodes or groups of elements and nodes. Behavioral information is concerned with how elements and nodes, or groups of elements and nodes, react to stimuli to which they are subjected. The stimuli may be long term stimuli, as in the case of hot electrons in an electrical structure or rust in a mechanical structure, or short term stimuli, such as changes in voltage, temperature, or load conditions. For instance, the load condition of a bridge changes as a person drives across it; this change is temporary and is therefore a short term stimuli.

Structural and behavioral information of the elements and nodes will of course vary according to the type of structure being analyzed. For instance, voltages and capacitances at various nodes of an electrical circuit are typically critical indicators of proper operation of the circuit. In the case of an electrical circuit, a netlist, or external representation of the circuit, simply specifies the physical interconnections or nodes between the electrical elements without providing information about various electrical parameters or measurements at those nodes. A netlist, then, is by itself insufficient to provide needed information about the nodes of an electrical circuit.

There is therefore an unmet need in the art to be able to obtain and analyze structural and behavior information about elements and nodes of a system or structure during the design phase of the system or structure.

SUMMARY OF THE INVENTION

It is therefore an object of the present invention to be able to obtain and analyze structural and behavior information about elements and nodes of a system or structure during the design phase of the system or structure.

Therefore, according to the present invention, a rules checking methodology analyzes a structure or system characterized as having one or more elements having one or more nodes as connection points to the elements. The first step of the rules checking methodology of the present invention is to create an internal representation of the structure to be analyzed. Expected arrangements of the elements of the structure are found by searching for and extracting known topology types. Next, an analysis of the elements and nodes of the structure is performed. All rules associated with a particular element or node of the structure are applied to the element or node in order to determine if that element or node meets certain criteria established for it. Finally, a report that illustrates the statistics compiled during the analysis of the structure elements and nodes is made available.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

Any structure to be analyzed may be characterized as having a number of structural elements that are interconnected by nodes or as having at least one structural element and at least one node that serves as a connection point to the structural element. The structure may be any number of things, including, but not limited to, an electronic circuit, a bridge or other civil engineering structure, and a mechanical transmission. Each of these examples of structures are characterized as having elements interconnected by nodes. For instance, a bridge is made of a number of support members, such as wooden beams, interconnected by nodes called bolts.

Figure 1:
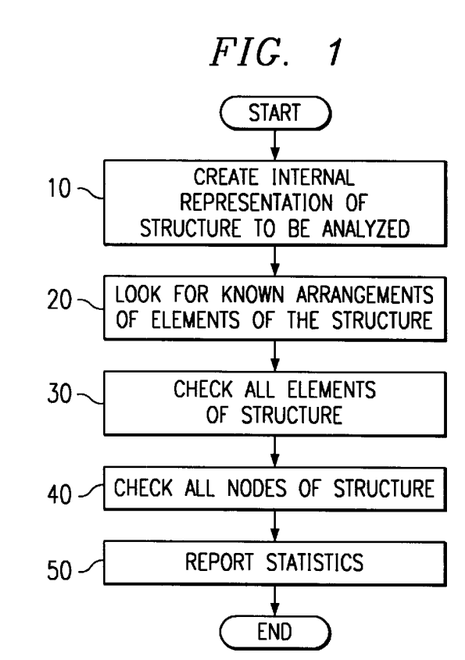
FIG. 1 illustrates a top level flow chart of rules checking code, according to the present invention.

Referring to FIG. 1, a top level flow chart of rules checking methodology, according to the present invention is shown. The first step of the methodology of the present invention, illustrated by Block 10, is to create an internal representation of the structure to be analyzed. The structure being analyzed may be an entire structure or system or it may simply be a subset of a larger structure or system. For instance, the rules checking methodology may be used to analyze an entire electrical system or it may be used to check only a portion of the entire electrical system, such as a circuit within the electrical system. In either case, what is being analyzed is referred to as the structure.

The next step is to search for known and expected arrangements of elements of the structure in Block 20 by looking for and extracting known topology types. For instance, if the structure being analyzed is an electronic circuit then certain pathsets between electronic elements of the circuit would be expected to be seen. If there are problems in the pathset, this would be indicative of problems in the netlist, or external representation, of the electronic circuit. The problems in the netlist could then be corrected. Known topology types of an electronic circuit could include, but would not be limited to, static gate outputs, dynamic precharge nodes, dynamic gate inputs, block inputs, block outputs, and latches. The rules checking software of the present invention even allows the user to provide the software with hints, such as giving the software a list of the latch nodes, as will be described hereinafter in conjunction with Block 24 of FIG. 2.

As an option, information concerning the extraction of the topologies may be provided to the designer. Such information might contain a list of the assumptions used to find and extract the topologies. Further, the information might be a list of all of the topologies found and extracted. Based upon this information, the designer may make adjustments to the assumptions used to find and extract topologies or provide other hints to the rules checking software through the external information file described in Block 24 of FIG. 2.

It should be noted that an alternative to extracting topology types for the netlist of an electronic circuit is to blindly apply all the rules to each and every node and element of the electronic circuit. This approach, however, makes developing the limits of the checks, to be discussed in greater detail with respect to Blocks 30 and 40, very difficult because the limits have to be set so that they are applicable to all elements and nodes of the structure. For instance, the parameters of a dynamic gate can be quite different from those used to check a static gate. Yet another alternative to extracting topology types is to rely on the structure designer to assign all the attributes to each and every element and node of the structure. This provides the advantage that the designer is aware of every assumption of the rules checking. However, this approach requires quite a bit of time of the designer and the person who enters all these rules into the rules checking code.

Next, in Blocks 30 and 40, an analysis of the elements and nodes of the structure is performed. In Block 30, a check is performed on all elements of the structure in which all rules associated with a particular element are then applied to the element to determine if that element passes or fails certain criteria established for it. For instance, a load bearing beam element of a bridge may be expected to support X amount of weight and this rule is applied to the load bearing beam element to ascertain whether it meets this requirement. In Block 40, a check is performed on all the nodes that interconnect the elements of the structure being tested. Finally, a report that illustrates the statistics compiled during the analysis of the structure elements and nodes is made available in Block 50. These steps of the methodology of the present invention will now be described in greater detail.

Figure 2:
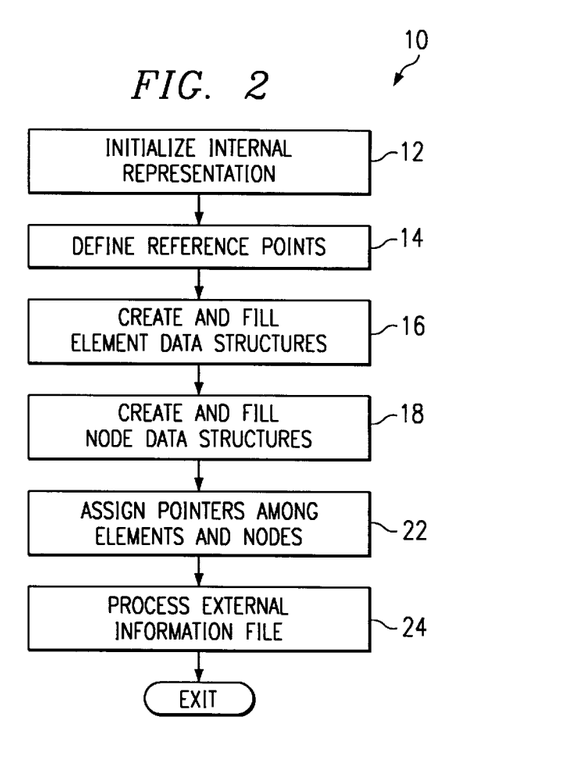
FIG. 2 illustrates the steps taken in Block 10 of FIG. 1 to create an internal representation of I-he structure to be analyzed, according to the present invention.

Referring to the flowchart of FIG. 2, the steps of Block 10 taken to create an internal representation of the structure to be analyzed are illustrated. First, in Block 12 the internal representation of the structure to be analyzed is initialized by creating data structures that are used to track overhead information, such as the version of the database, the size of the database, the number of elements of the structure, the number of nodes of the structure, and the pointers of the structure. Next, in Block 14, reference points of the structure are defined. A reference point is a connection point, or node, in the structure that must be known in order to adequately analyze the structure. For instance, in an electronic circuit structure, reference points might be ground and a power supply potential such as Vcc. In a bridge structure, a pylon might be a reference point that must be defined. In Block 16, a data structure is created for each element and data for each element is read into the data structure for that element. Likewise, in Block 18, a data structure is created for each node and data for each node is read into the data structure for that node. It must be noted that the order of Blocks 16 and 18 could be reversed so that the node data structures are created prior to the element data structures, if desired. At Block 22, pointers among elements and nodes of the structure are assigned in the code of the program. Finally, at Block 24, preprocessing of an external information file is performed. The external information file provided by the user at Block 24 contains additional information about the structure that aids in the analysis of the structure. The additional information may be the result of analysis performed by external analysis tools or it may simply be hints provided by the designer lo enhance the structural analysis. The external information file, for example, may contain a list of the latch nodes and precharge nodes of an electrical circuit being analyzed.

Figures 3, 4:
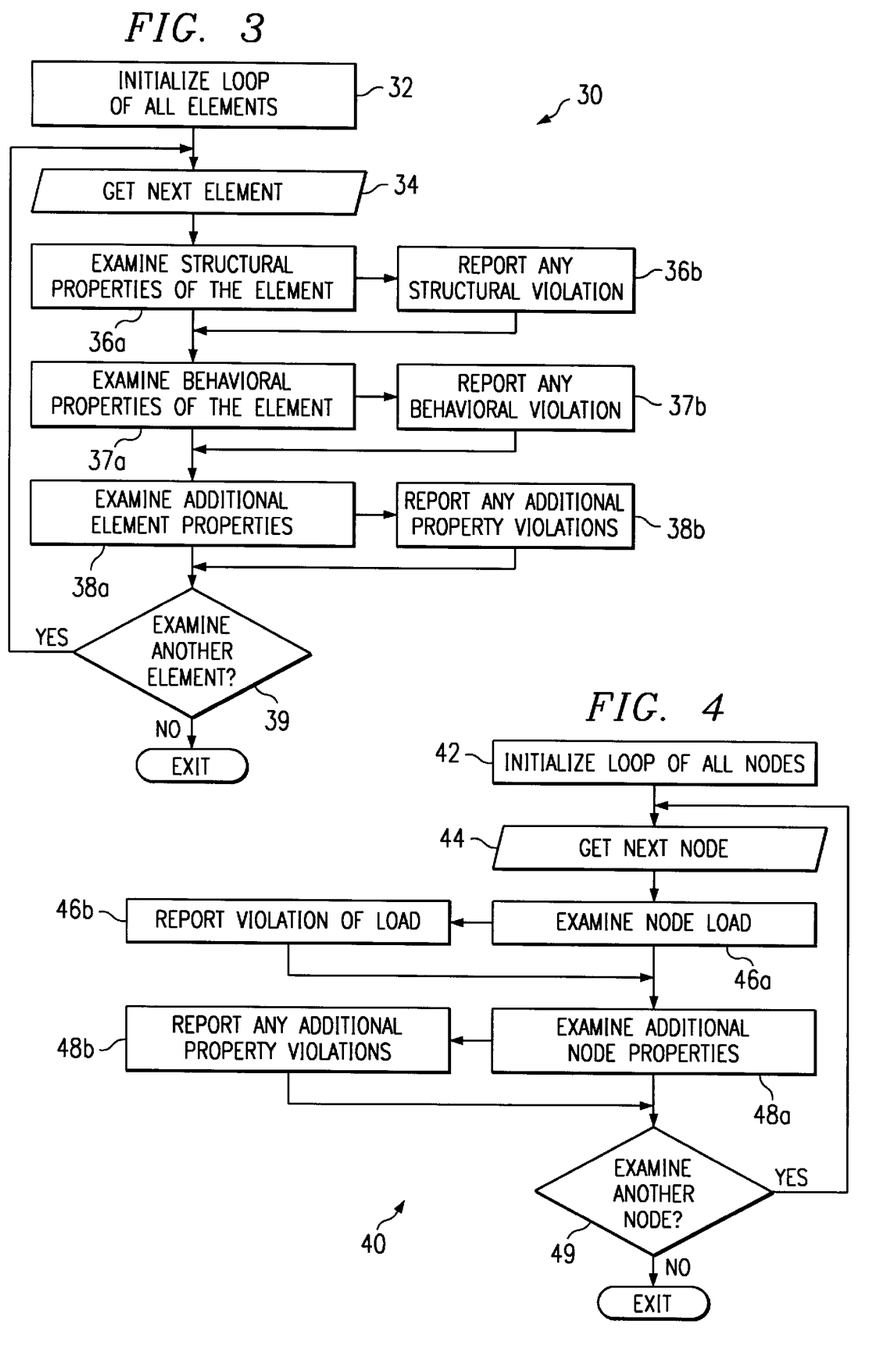
FIG. 3 illustrates the steps taken in Block 30 of FIG. 1 to perform a check on the elements of the structure to be analyzed, according to the present invention.
FIG. 4 illustrates the steps taken in Block 40 of FIG. 1 to perform a check on the nodes of the structure to be analyzed, according to the present invention.

Referring next to the flowchart of FIG. 3, the steps taken in Block 30 of FIG. 1 to perform a check on the elements of the structure to be analyzed are illustrated. In Block 32, the loop of the elements of the structure are initialized. Next, in Block 34, an element to be analyzed is chosen. One or more properties of the element is then examined at Blocks 36–38. The properties to be examined may be structural properties, as in Block 36*a*, or behavioral properties, as in Block 37*a*. Examination of multiple properties of an element could be performed simultaneously, in parallel, if so desired to reduce the time associated with the examination of an element.

Structural properties have to do with how elements and nodes interact with respect to one another. The structure of an element or node, or a group of elements and nodes, can affect the behavior of other elements or nodes or groups of elements and nodes. A dimension of an element is an example of a structural property and may be any relevant characteristic of the element that is of particular concern. For instance, if the element is a transistor, such as a field effect transistor (FET), the dimension could be the gate width of the transistor. Or, if the element is a beam of a bridge, the dimension to be examined could be the cross-section of the beam or the material of the beam. As another example, consider the element to be a gear of a transmission, with the dimension being the thickness of the gear. Behavioral properties have to do with how elements and nodes, or groups of elements and nodes, react to stimuli to which they are subjected. The stimuli may be long term stimuli, as in the case of hot electrons in an electrical structure or rust in a mechanical structure, or short term stimuli, such as changes in voltage, temperature, or load conditions.

If the structural property being examined at Block 36*a* is not within acceptable limits, then the violation is reported at Block 36*b*. Similarly, if the behavioral property being examined at Block 37*a* is not within acceptable limits, then the violation is reported at Block 37*b*. Limits may be expressed in various forms well known in the art. Linear limits may be expressed as a lower limit, an upper limit, or within ±a limit. For non-linear measurements, the use of polynomial coefficients and look-up tables may be used. Moreover, acceptable limits of a dimension may be set by the user of the invention to any desirable value. In the case of the beam of a bridge as the element, it may be that the cross-section of the beam must conform to one of four measurements. If the beam being tested has a cross-section that falls outside the four acceptable measurements, the violation would be reported at Block 37b. Additional structural or behavior properties of an element are examined at Block 38a and any additional property violations are reported at Block 38b as shown. Finally, at Decision Block 39 the process is directed back to Block 34 if more elements are to be examined or returns back to Block 40 of the overall flow of FIG. 1 if all elements to be analyzed have been examined.

Similar in flow to FIG. 3, in FIG. 4 the steps taken in Block 40 of FIG. 1 to perform a check on the nodes of the structure to be analyzed are illustrated. In Block 42, the loop of the nodes of the structure are initialized. Next, in Block 44, a node to be analyzed is chosen. The load or other property of the selected node is examined at Block 46a. If the load is not within acceptable limits, the violation is reported at Block 46b. Acceptable limits of a load may be set by the user of the invention to be any appropriate value. Consider, for instance, an electronic circuit example in which the voltage at a node is being measured. The acceptable value of voltage may be 5±0.5 volts. If the voltage at the node being tested in less than 4.5 volts or greater than 5.5 volts, then the violation would be reported at Block 46b. At Block 48a additional node properties are examined for a particular node and any additional property violations that may exist are reported at Block 48b. Finally, at Decision Block 49 the process is directed back to Block 44 if more nodes are to be examined or returned to Block 50 of the overall flow of FIG. 1 if all nodes to be analyzed have been examined.

A word concerning node loads is appropriate here. A node load may be thought of as any measurable characteristic of concern at the node. For instance, in an electrical circuit the capacitance or voltage present at a particular node that interconnects electrical elements may be important to know. Similarly, the amplitude or frequency of a signal at the node in such a circuit may be critical. Or, in a bridge, the load-bearing properties of a fulcrum between two or more beams might be examined. In civil engineering endeavors, it is not uncommon to pre-load a beam in order to position it at a given location, and such pre-loaded beams are to be analyzed differently than other types of beams. Moreover, there are different types of nodes that may be examined. Consider a storage node. In an electric circuit, a storage node, such as a latch node, may store capacitance or voltage. In a mechanical system, the storage node may be a spring that stores energy. Storage nodes and precharge nodes are commonly found in electrical circuits.

The examination of multiple properties or loads of a node could be performed simultaneously, in parallel, if so desired to reduce the time associated with the examination of a node. Additionally, examination of properties of one or more elements as shown in FIG. 3 could be performed simultaneously to the examination of properties of one or more nodes of FIG. 4.

It is important to note that once analysis of an element or node has commenced, the analysis of that element or node continues until it is complete to as indicated in FIGS. 3 and 4. For instance, if the program employs a single processing unit, then analysis of the element or node occurs in a sequential fashion such that once analysis of a particular element or node commences, the analysis continues until it is complete for that element or node. Analysis of the rules and properties of another element or node does not commence until the analysis for the previous element or node is complete. If, on the other hand, the program employs two or more processors operating in a parallel fashion, then each processor may operate at the same time as any processor, but analysis of a particular element or node by a particular processor is completed before analysis of another element or node by the same processor may commence. The processor could be, but is not limited to, any electrical, mechanical or biological data processing unit such as a microprocessor, an electromechanical device, or a person. An important advantage of this approach to analysis ordering to examine all the rules or properties of a particular element or node at one time is that the locality of the structure data for the elements and nodes is maintained for the analysis, thereby speeding up the analysis and making it more efficient.

Figure 5:
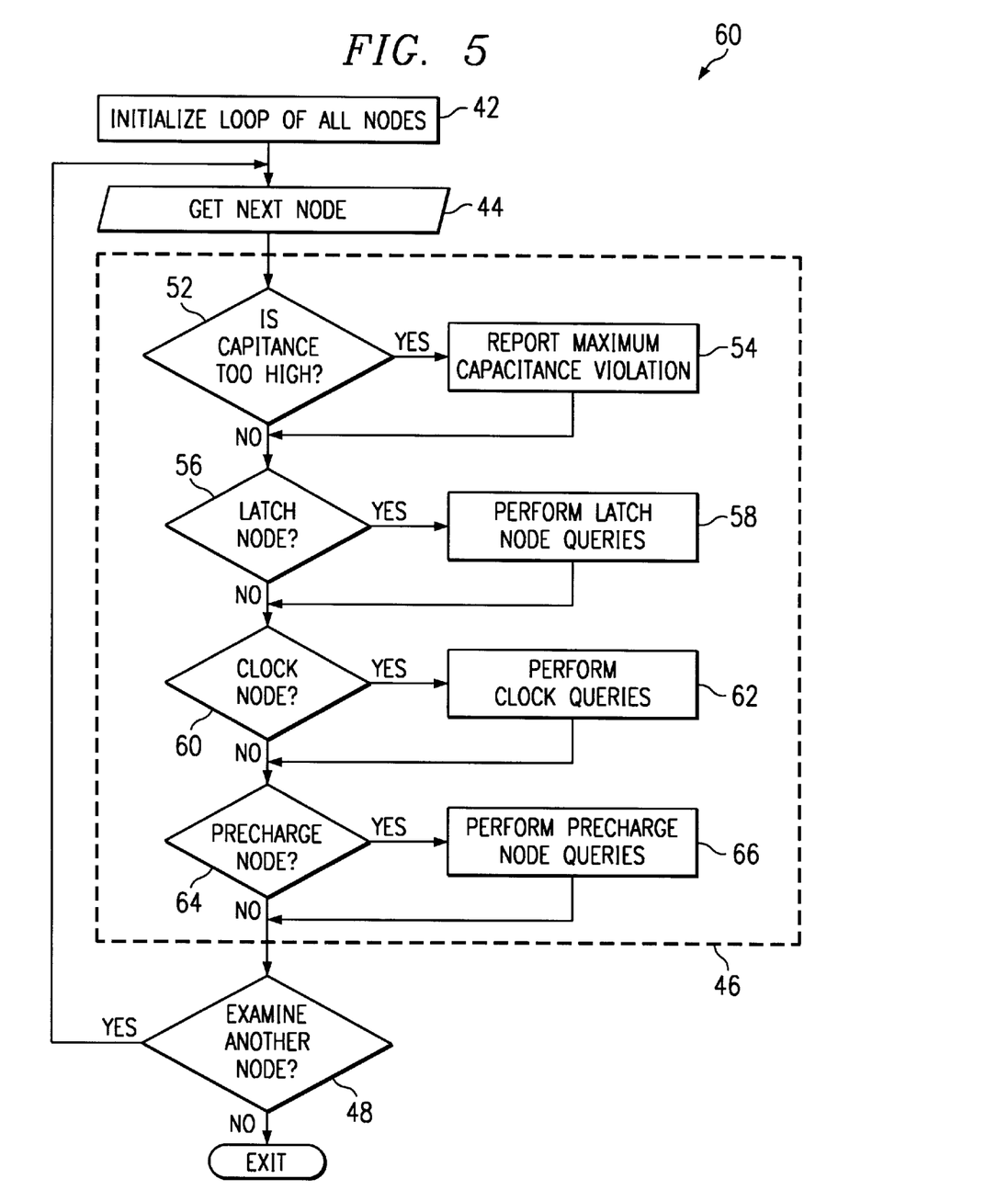
FIG. 5 illustrates a more detailed example of the flow chart of FIG. 4 for an electronic circuit, according to the present invention.

Reference to FIG. 5 provides a more detailed example of the flow of FIG. 4 for an electronic circuit. Similar node analysis may likewise be performed on other structure types, such as mechanical and civil engineering structures. Particular emphasis is placed on possibilities for Block 46, which encompasses various types of node analysis. Decision Block 52 inquires about whether capacitance at the node being examined is within capacitance limits. If it is not, then violation of the acceptable capacitance for that particular node is reported at Block 54. Next, Decision Blocks 56, 60, and 64 inquire about the type of node and then perform appropriate testing. Decision Block 56 inquires as to whether the node is a latch node. If the node being examined is a latch node, then latch node inquiries are performed at Block 58. At Block 60, the question is whether the node is characterized as being a clock signal. If so, then inquiries about the clock signal are performed at Block 62. Finally, at Decision Block 64 the flow is directed to Block 66 for precharge node testing if the node is a precharge node.

While the examination of node loads is performed in a chronological, serial fashion in Block 46, one skilled in the art will easily recognize that the queries of Blocks 52 to 64 could be performed in parallel to one another to reduce the run time required to complete node testing. For instance, the capacitance testing of Blocks 52 and 54 could be performed simultaneously with the latch node testing of Blocks 56 and 58 and the clock signal testing of Blocks 60 and 62. As an example, such parallel testing could be employed in a system having, for instance, 10 microprocessor units, in order to test a structure having 1,000 or more nodes, with each processing unit simultaneously testing 100 different nodes of the structure.

Figure 6:
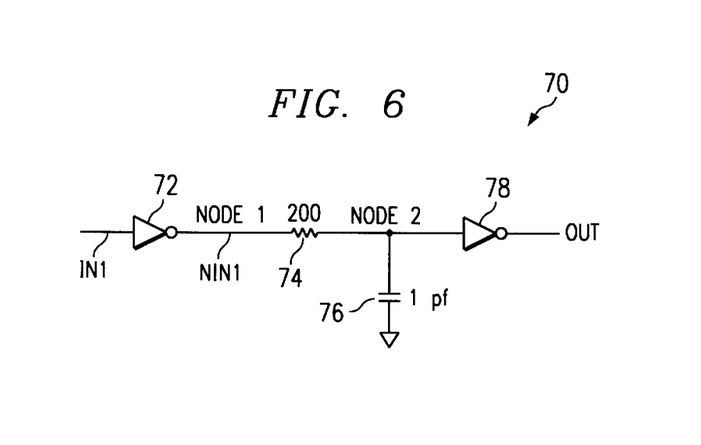
FIG. 6 illustrates a simplified electrical schematic of a RC delay circuit upon which the methodology of the present invention can be used, according to the present invention.

Referring to FIG. 15, a simplified electrical schematic of a RC delay circuit upon which the methodology of the present invention can be used is shown. Inverter 72 receives an input signal IN1 that is inverted to produce signal NIN1 at Node 1. Resistor 74 is valued at 200 Ohms while capacitor 76 is valued at 1 pF. The signal at Node 2 is provided to Inverter 78 where it is inverted to form output signal Out.

The RC delay at Node 2 formed by the electrical connection of resistor 74, capacitor 76, and Inverter 78 is calculated by multiplying the resistance of resistor 74 by the capacitance of Node 2, represented by capacitor 76. In the example of FIG. 6, the RC delay is 200 pS. Now, applying the methodology of the present invention embodied in FIG. 1, at Block 10 the internal representation of the RC delay circuit of FIG. 6 is created. First, structures that track overhead information of the type discussed in conjunction with Block 12 are created. Reference points of the RC delay circuit are next defined at Block 14. For instance, the ground potential to which Node 2 is connected through capacitance 76 is defined.

Next, the data structures of the elements, inverters 72, 78, and resistor 74, and the data structure of nodes Node 1 and Node 2 are created as illustrated by Blocks 16 and 18. It must be noted that the data structure created for an element or node may be the element or node itself, or it may be subelements that together define the element or node. Consider, for example, inverter 72. The data structure for inverter 72 may be an inverter structure or it may be two field effect transistors that together equal an inverter. Upon forming the data structures of the elements and nodes, data representative of elements 72, 74, 78 and of nodes Node 1, Node 2 is read in and placed within the data structures formed. For instance, the resistance of 200 Ohms is data that is associated with the data structure of resistor 200; likewise, the capacitance of 1 pF is an attribute of Node 2 that fills the data structure of Node 2. It should be noted that the capacitance represented by capacitor 76 may or may not be considered a separate element of the circuit. In this case, the capacitance is not considered a separate element but is rather considered an attribute of Node 2. Next, at Block 22, pointers are assigned between the elements and nodes of FIG. 6.

Referring again to the overview of FIG. 1, at Block 20 a search for known arrangements of the elements of the RC delay circuit is conducted. Next, at Blocks 30 and 40 the elements and nodes of the RC delay circuit are analyzed. In the RC delay circuit of FIG. 6, the critical part of the circuit is the RC delay at Node 2. So, referring to Blocks 46 and 47 the RC delay between Node 1 and Node 2 is examined. In this example, the RC delay between Node 1 and Node 2 is 200 pS. Now, suppose the acceptable upper limit is only 100 pS. Since the acceptable RC delay between Node 1 and Node 2 has been exceeded, this violation is reported at Block 47. The form of the violation report can take any form desired and may contain any important information. For instance, the error message could read as follows:

"RC delay node: Node 2 rc_delay: 200 pS limit: 100 ps Failed_by_pct: 100.0

Finally, at Block 50 the statistics of RC delay circuit of FIG. 6 are reported.

The rules checking methodology of the present invention ensures the quality of a structure or system having one or more elements and one or more nodes that serve as connection points to the elements. The rules checking methodology examines the elements and nodes of the structure and makes decisions regarding the quality of the structure according to parameters provided by the structure designer. In the case of an electronic circuit, for instance, the parameters could include capacitance, resistance, and transistor size. Additionally, extracted information from analyzing equipment, such as timing analyzers, which provide slope, delay, and signal validity data, and automatic routers, which provide wire length data, may be used by the rules checking methodology of the present invention. Quality checks of an electronic circuit can be used to verify that the electronic circuit is immune to noise, temperature, voltage, and process variations. While most of the checks performed on an electronic circuit are limit checks of behavioral and structural properties, e.g. checking the size of a field effect transistor (FET), for instance, the rules checking methodology may also be used to perform existence checks for various types of properties such as checking a block input of a noise sensitive circuit.

While the invention has been particularly shown and described with reference to a preferred embodiment, it will be understood by those skilled in the art that various changes in form and detail may be made therein without departing from the spirit and scope of the invention.

What is claimed is:

1. A method of using a processor to analyze and enhance a design of a structure, comprising the steps of:

creating a representation of the structure, having a plurality of structural entities, wherein a structural entity of the plurality of structural entities is defined as an element or a node that is a connection point to an element and wherein the plurality of structural entities comprises at least one element and at least one node and wherein creating the representation of the structure comprises the steps of:

defining one or more reference points of the structure;

creating a data structure for each structural entity of the plurality of structural entities and filling the data structure with data;

assigning pointers among the plurality of structural entities of the structure;

providing to the processor an external information file containing information external to the representation about the structure to enhance analysis of the design of the structure; and processing the external information file; and using the processor to analyze the plurality of structural entities to determine whether each structural entity of the plurality of structural entities meets established criteria, wherein once analysis by a processor of a first structural entity of the plurality of structural entities is commenced, analysis by the processor of a second structural entity of the plurality of structural entities does not commence until the analysis of the first structural entity is complete.

2. The method of claim 1, comprising the further step of reporting whether each structural entity of the plurality of structural entities meets established criteria.

3. The method of claim 1, wherein prior to the step of defining one or more reference points of the structure, comprising the further step of:

initializing the initial representation of the structure.

4. The method of claim 3, wherein the step of initializing the initial representation of the structure comprises creating one or more global data structures.

5. The method of claim 4, wherein the one or more global data structures contain overhead information about the structure to be analyzed.

6. The method of claim 1, wherein the step of creating a data structure for each structural entity of the plurality of structural entities and filling the data structure with data may be performed simultaneously for two or more structural entities of the plurality of structural entities.

7. The method of claim 1, wherein the step of analyzing the plurality of structural entities to determine whether each structural entity of the plurality of structural entities meets established criteria comprises the step of:

examining at least one property of each structural entity of the plurality of structural entities to determine whether each property of each structural entity is within an acceptable limit.

8. The method of claim 7, wherein the step of examining at least one property of each structural entity of the plurality of structural entities may be performed simultaneously for two or more structural entities of the plurality of structural entities by two or more processors.

9. The method of claim 7, wherein a plurality of properties of each structural entity is examined simultaneously.

10. The method of claim 7, wherein after the step of examining at least one property of each structural entity comprising the further step of:
    reporting when each property of each structural entity is not within the acceptable limit.

11. A method of using a processor to analyze and enhance a design of a structure, comprising the steps of:
    creating a representation of the structure, having a plurality of structural entities, wherein a structural entity of the plurality of structural entities is defined as an element or a node that is a connection point to an element and wherein the plurality of structural entities comprises at least one element and at least one node;
    searching for and extracting each known topology of one or more known topologies of the structure;
    using the processor to analyze the plurality of structural entities to determine whether each structural entity of the plurality of structural entities meets established criteria, wherein once analysis by a processor of a first structural entity of the plurality of structural entities is commenced, analysis by the processor of a second structural entity of the plurality of structural entities does not commence until the analysis of the first structural entity is complete;
    as a result of the analysis of the plurality of structural entities of the structure, a user making adjustments to a set of assumptions used to search for and extract each known topology type of the one or more known topologies through an external information file provided to the processor containing information external to the representation in order to enhance analysis of the design of the structure; and
    using the processor to reanalyze the plurality of structural entities of the structure in accordance with the adjusted set of assumptions used to search for and extract each known topology type of the one or more known topologies.

12. The method of claim 11, wherein the step of creating the internal representation of the structure to be analyzed comprises the steps of:
    defining one or more reference points of the structure;
    creating a data structure for each structural entity of the plurality of structural entities and filling the data structure with data;
    assigning pointers among the plurality of structural entities of the structure;
    providing to the processor the external information file containing information about the structure; and
    processing the external information file.

13. The method of claim 12, wherein prior to the step of defining one or more reference points of the structure, comprising the further step of:
    initializing the initial representation of the structure.

14. The method of claim 13, wherein the step of initializing the initial representation of the structure comprises creating one or more global data structures.

15. The method of claim 14, wherein the one or more global data structures contain overhead information about the structure to be analyzed.

16. The method of claim 12, wherein the step of creating a data structure for each structural entity of the plurality of structural entities and filling the data structure with data may be performed simultaneously for two or more structural entities of the plurality of structural entities.

17. The method of claim 11, wherein the step of analyzing the plurality of structural entities to determine whether each structural entity of the plurality of structural entities meets established criteria comprises the step of:
    examining at least one property of each structural entity of the plurality of structural entities to determine whether each property of each structural entity is within an acceptable limit.

18. The method of claim 17, wherein the step of examining at least one property of each structural entity of the plurality of structural entities may be performed simultaneously for two or more structural entities of the plurality of structural entities by two or more processors.

19. The method of claim 17, wherein a plurality of properties of each structural entity is examined simultaneously.

20. The method of claim 17, wherein after the step of examining at least one property of each structural entity comprising the further step of:
    reporting when each property of each structural entity is not within the acceptable limit.

21. The method of claim 11, comprising the further step of reporting whether each structural entity of the plurality of structural entities meets established criteria.

22. The method of claim 11, wherein the structure to be analyzed is a subset of a larger structure.

23. A storage media containing a computer program for analyzing and enhancing a design of a structure, comprising:
    instructions for creating a representation of the structure, having a plurality of structural entities, wherein a structural entity of the plurality of structural entities is defined as an element or a node that is a connection point to an element and wherein the plurality of structural entities comprises at least one element and at least one node, further comprising:
    instructions for defining one or more reference points of the structure;
    instructions for creating a data structure for each structural entity of the plurality of structural entities and filling the data structure with data;
    instructions for assigning pointers among the plurality of structural entities of the structure;
    instructions for receiving an external information file provided to the processor containing information external to the representation about the structure to enhance analysis of the design of the structure; and
    instructions for processing the external information file; and
    instructions for using the processor to analyze the plurality of structural entities to determine whether each structural entity of the plurality of structural entities meets established criteria, wherein once analysis by a processor of a first structural entity of the plurality of structural entities is commenced, analysis by the processor of a second structural entity of the plurality of structural entities does not commence until the analysis of the first structural entity is complete.

24. The media of claim 23, further comprising:
    instructions for reporting whether each structural entity of the plurality of structural entities meets established criteria.

25. The media of claim 23, wherein prior to the instructions for defining one or more reference points of the structure, comprising the further instructions of:
    instructions for initializing the initial representation of the structure.

26. The media of claim 25, wherein the instructions for initializing the initial representation of the structure comprises instructions for creating one or more global data structures.

27. The media of claim 26, wherein the one or more global data structures contain overhead information about the structure to be analyzed.

28. The media of claim 23, wherein the instructions for creating a data structure for each structural entity of the plurality of structural entities and filling the data structure with data may be performed simultaneously for two or more structural entities of the plurality of structural entities.

29. The media of claim 23, wherein the instructions for analyzing the plurality of structural entities to determine whether each structural entity of the plurality of structural entities meets established criteria comprises:

instructions for examining at least one property of each structural entity of the plurality of structural entities to determine whether each property of each structural entity is within an acceptable limit.

30. The media of claim 29, wherein the instructions for examining at least one property of each structural entity of the plurality of structural entities may be performed simultaneously for two or more structural entities of the plurality of structural entities by two or more processors.

31. The media of claim 29, wherein a plurality of properties of each structural entity is examined simultaneously.

32. The media of claim 29, wherein after the instructions for examining at least one property of each structural entity further comprising:

instructions for reporting when each property of each structural entity is not within the acceptable limit.

33. A storage media containing a computer program for analyzing and enhancing a design of a structure, comprising:

instructions for creating a representation of the structure, having a plurality of structural entities, wherein a structural entity of the plurality of structural entities is defined as an element or a node that is a connection point to an element and wherein the plurality of structural entities comprises at least one element and at least one node;

instructions for searching for and extracting each known topology of one or more known topologies of the structure;

instructions for using the processor to analyze the plurality of structural entities to determine whether each structural entity of the plurality of structural entities meets established criteria, wherein once analysis by a processor of a first structural entity of the plurality of structural entities is commenced, analysis by the processor of a second structural entity of the plurality of structural entities does not commence until the analysis of the first structural entity is complete;

as a result of the analysis of the plurality of structure entities of the structure, instructions for receiving an adjusted set of assumptions used to search for and extract each known topology type contained in an external information file external to the representation that has been updated by a user to include the adjusted set of assumptions in order to enhance analysis of the design of the structure; and instructions for using the processor to reanalyze the plurality of structural entities of the structure in accordance with the adjusted set of assumptions.

34. The media of claim 33, wherein the instructions for creating the internal representation of the structure to be analyzed comprises:

instructions for defining one or more reference points of the structure;

instructions for creating a data structure for each structural entity of the plurality of structural entities and filling the data structure with data; and instructions for assigning pointers among the plurality of structural entities of the structure;

instructions for receiving the external information file provided to the processor containing information external to the representation about the structure to enhance analysis of the design of the structure; and instructions for processing the external information file.

35. The media of claim 34, wherein prior to the instructions for defining one or more reference points of the structure, further comprising:

instructions for initializing the initial representation of the structure.

36. The media of claim 35, wherein the instructions for initializing the initial representation of the structure comprises instructions for creating one or more global data structures.

37. The media of claim 36, wherein the one or more global data structures contain overhead information about the structure to be analyzed.

38. The media of claim 34, wherein the instructions for creating a data structure for each structural entity of the plurality of structural entities and filling the data structure with data may be performed simultaneously for two or more structural entities of the plurality of structural entities.

39. The media of claim 33, wherein the instructions for analyzing the plurality of structural entities to determine whether each structural entity of the plurality of structural entities meets established criteria comprises:

instructions for examining at least one property of each structural entity of the plurality of structural entities to determine whether each property of each structural entity is within an acceptable limit.

40. The media of claim 39, wherein the instructions for examining at least one property of each structural entity of the plurality of structural entities may be performed simultaneously for two or more structural entities of the plurality of structural entities by two or more processors.

41. The media of claim 39, wherein a plurality of properties of each structural entity is examined simultaneously.

42. The media of claim 39, wherein after the instructions for examining at least one property of each structural entity further comprising:

instructions for reporting when each property of each structural entity is not within the acceptable limit.

43. The media of claim 33, further comprising the instructions for reporting whether each structural entity of the plurality of structural entities meets established criteria.

44. The media of claim 33, wherein the structure to be analyzed is a subset of a larger structure.

45. The method of claim 1, further comprising the steps of:

as a result of the analysis of the plurality of structural entities of the structure, a user updating the information of the external information file to create an updated representation of the structure; and using the processor to reanalyze the plurality of structural entities of the structure in accordance with the updated representation of the structure to enhance the design of the structure.

46. The method of claim 11, comprising the further step of:

providing topology information about the extraction of each known topology type to a user.

47. The method of claim 46, wherein the topology information is a list of each known topology extracted.

48. The method of claim 11, wherein prior to the step of making adjustments to the set of assumptions, comprising the further step of:

providing to the user the set of assumptions used to search for and extract each known topology type.

49. The media of claim 23, further comprising:

instructions for creating an updated representation of the structure when provided with updated information of the external information file from a user; and instructions for using the processor to reanalyze the plurality of structural entities of the structure in accordance with the updated representation of the structure to enhance the design of the structure.

50. The media of claim 33, further comprising:

instructions for providing topology information about the extraction of each known topology type to a user.

51. The media of claim 50, wherein the topology information is a list of each known topology extracted.

52. The media of claim 33, further comprising:

providing to the user a set of assumptions used to search for and extract each known topology type.

\* \* \* \* \*